(12) United States Patent
Yoshiyama

(10) Patent No.: US 8,565,962 B2
(45) Date of Patent: Oct. 22, 2013

(54) REWRITING SYSTEM FOR A VEHICLE

(75) Inventor: Takuya Yoshiyama, Wako (JP)

(73) Assignee: Honda Motor Co., Ltd., Tokyo (JP)

(*) Notice: Subject to any disclaimer, the term of this patent is extended or adjusted under 35 U.S.C. 154(b) by 726 days.

(21) Appl. No.: 12/758,278

(22) Filed: Apr. 12, 2010

(65) Prior Publication Data
US 2010/0262334 A1 Oct. 14, 2010

(30) Foreign Application Priority Data

Apr. 13, 2009 (JP) ................................ 2009-097357

(51) Int. Cl.
*G06F 7/00* (2006.01)

(52) U.S. Cl.
USPC ......... 701/33.1; 701/29.1; 701/115; 701/102; 711/103; 711/155; 307/10.1; 365/185.29

(58) Field of Classification Search
USPC ............... 701/29.1, 33.1, 115; 711/103, 155; 307/10.1; 365/185.29
See application file for complete search history.

(56) References Cited

U.S. PATENT DOCUMENTS

| | | | | |
|---|---|---|---|---|
| 5,491,631 | A * | 2/1996 | Shirane et al. | 701/29.6 |
| 6,127,947 | A * | 10/2000 | Uchida et al. | 340/999 |
| 6,230,082 | B1 * | 5/2001 | Harada et al. | 701/1 |
| 6,243,627 | B1 * | 6/2001 | Ozeki | 701/29.2 |
| 6,285,948 | B1 * | 9/2001 | Takagi et al. | 701/115 |
| 6,289,510 | B1 * | 9/2001 | Nakajima | 717/170 |
| 7,068,147 | B2 * | 6/2006 | Suganuma et al. | 340/5.74 |
| 7,139,908 | B2 * | 11/2006 | Hamamoto et al. | 713/2 |
| 7,404,028 | B2 * | 7/2008 | Baltes | 711/103 |
| 8,042,104 | B2 * | 10/2011 | Kondo | 717/168 |
| 2001/0002814 | A1 * | 6/2001 | Suganuma et al. | 340/5.74 |
| 2002/0128758 | A1 * | 9/2002 | Hiramatsu | 701/29 |
| 2003/0009271 | A1 * | 1/2003 | Akiyama | 701/33 |
| 2003/0041217 | A1 * | 2/2003 | Terada et al. | 711/154 |
| 2003/0050747 | A1 * | 3/2003 | Kamiya | 701/33 |
| 2004/0002793 | A1 * | 1/2004 | Tachibana et al. | 701/1 |
| 2005/0034034 | A1 * | 2/2005 | Kamada | 714/52 |
| 2006/0155941 | A1 * | 7/2006 | Yamaguchi | 711/154 |
| 2006/0218340 | A1 * | 9/2006 | Fujita et al. | 711/103 |
| 2006/0259208 | A1 * | 11/2006 | Ota | 701/1 |
| 2007/0005204 | A1 * | 1/2007 | Yamamoto et al. | 701/35 |
| 2010/0191637 | A1 * | 7/2010 | Alderucci et al. | 705/37 |

FOREIGN PATENT DOCUMENTS

| | | |
|---|---|---|
| EP | 1109085 A2 | 6/2001 |
| EP | 1705565 A2 | 9/2006 |
| EP | 1990752 A2 | 11/2008 |
| JP | 2008-143418 | 6/2008 |
| JP | 2008-168649 | 7/2008 |

* cited by examiner

*Primary Examiner* — Thomas Black
*Assistant Examiner* — Sara Lewandroski
(74) *Attorney, Agent, or Firm* — Rankin, Hill & Clark LLP

(57) ABSTRACT

A rewriting system comprises a plurality of electronic control units mounted on a vehicle, each of the plurality of electronic control units including a storage for storing control information, and a device for sending new control information to rewrite the control information stored in the storages of the plurality of electronic control units with the new control information. One of the plurality of electronic control units is configured to make a determination whether the rewriting in the other electronic control units has been completed in response to a completion of the rewriting in the one of the plurality of electronic control units, and make a notification of a result of the determination. Thus, the progress of the rewriting for a plurality of control units is automatically determined and notified to a user. The user can immediately recognize the progress of the rewriting work.

6 Claims, 6 Drawing Sheets

REWRITING SYSTEM FOR A VEHICLE

BACKGROUND OF THE INVENTION

The present invention relates to a system for rewriting information stored in electronic control units mounted on a vehicle.

Conventionally, a technique for rewriting information stored in an Electronic Control Unit (ECU) mounted on a vehicle has been proposed. In Japanese Patent Publication Laid-Open (JP-A) No. 2008-143418, it is described that a user is informed of a normal completion or abnormal completion of rewriting data in a flash memory of an ECU by using an indicator lamp.

In recent vehicles, in order to variously control a vehicle with better accuracy, a plurality of electronic control units are mounted. In memories of these electronic control units, information such as programs and related data is stored such that the electronic control units implement various controls. The stored information needs to be rewritten, for example, for upgrading to a new version. Of course, such rewriting may need to be performed for not only one electronic control unit, but also a plurality of electronic control units.

According to a conventional technique, when rewriting is performed on a plurality of electronic control units, an external apparatus is connected to the vehicle to access each electronic control unit. It is required that the external apparatus examines a version of information currently stored in each electronic control unit so as to determine whether the information currently stored in each electronic control unit has been already rewritten or has not been yet rewritten. Furthermore, in order to update the stored information, it is required to download new information into the external apparatus and then rewrite the old information with the new information on each of the plurality of the electronic control units in turn.

In such rewriting work, it is difficult to check the progress, that is, check which information of which electronic control unit has been completely rewritten at the present time. If the progress becomes unknown, it is required to serially examine the contents of the memory of each electronic control unit and determine whether the rewriting has been completed or not. The above patent document discloses a technique for informing a user of whether rewriting ends in a normal completion or not, which relates to a single electronic control unit. In a plurality of electronic control units, such a technique does not enable a user to grasp the progress, that is, grasp which information of which electronic control unit has been completely rewritten at the present time.

Furthermore, the external apparatus is operated by a user. During rewriting, the user who operates the external apparatus may be changed to another user. Because grasping the progress of the rewriting work is difficult as described above, an unrewritten portion may occur due to a subsequent user operation after such a change of the user. If an unrewritten portion occurs, there is no way to inform a user of this.

Therefore, a technique is desired for, when information stored in a plurality of electronic control units is rewritten (updated), enabling a user to immediately grasp a progress of the rewriting such that the rewriting is completely performed on the plurality of electronic control units without causing an unrewritten portion.

SUMMARY OF THE INVENTION

According to one aspect of the present invention, a rewriting system comprises a plurality of electronic control units mounted on a vehicle, each of the plurality of electronic control units including a storage for storing control information, and a device for sending new control information to rewrite the control information stored in the storages of the plurality of electronic control units with the new control information. One of the plurality of electronic control units is configured to make a determination whether the rewriting in the other electronic control units has been completed in response to a completion of the rewriting in the one of the plurality of electronic control units, and make a notification of a result of the determination.

According to this invention, when control information in a plurality of electronic control units is rewritten, one of the plurality of the electronic control units determines whether the rewriting in the other electronic control units has been completed and notifies the result of the determination. Therefore, the progress of the rewriting work on the plurality of electronic control units can be automatically determined. A user can immediately recognize the progress of the rewriting work. As a result, the rewriting in the plurality of electronic control units can be completed without causing an unrewritten portion.

According to one embodiment of the present invention, the device sends a program for implementing the determination to the one of the plurality of electronic control units. The one of the plurality of electronic control units makes the determination by executing the program in response to the completion of the rewriting in the one of the plurality of electronic control units.

According to this invention, a program for determining whether the rewriting in the other electronic control units has been completed is loaded into one of the plurality of electronic control units. Therefore, the progress of the rewriting work can be automatically determined and then notified to a user.

According to one embodiment of the present invention, the one of the plurality of electronic control units makes the notification by outputting an identification code of each of one or more electronic control units for which it is determined that the rewriting is not completed such that a diagnosis apparatus can read and display the identification code.

According to this invention, because one or more electronic control units in which the rewriting has not been completed are identified and displayed as identification codes on a diagnosis apparatus, a user can immediately recognize which electronic control unit has not been rewritten by viewing such a display. Therefore, even when a user is changed and another user takes over the rewriting work, the rewriting in the plurality of electronic control units can be completed without avoiding an occurrence of an unrewritten portion. Furthermore, because an existing diagnosis apparatus can be used for recognizing one or more electronic control units in which the rewriting has not been completed, a system that is convenient for maintenance staff can be provided while avoiding high costs.

According to one embodiment of the present invention, even if a request for cancelling the notification is received from the diagnosis apparatus, the one of the plurality of electronic control units continues the notification without cancelling until the rewriting in the plurality of electronic control units has been completed.

A diagnosis apparatus is generally configured to be capable of cancelling the output of the identification code by sending a predetermined clear command to a control unit. However, if such cancel of the notification is made during the rewriting work, a user may erroneously recognize that there is no control unit in which the rewriting has not been completed. According to this invention, such cancel of the notification is suppressed and the output of the code for identifying a control unit in which the rewriting has not been completed is continued until the rewriting is completed for all the control units. Therefore, such erroneous recognition by a user can be prevented.

Other features and advantages of the present invention will be apparent from the following detailed description of the present invention and the accompanying drawings.

DESCRIPTION OF THE PREFERRED EMBODIMENTS

Figure 1:
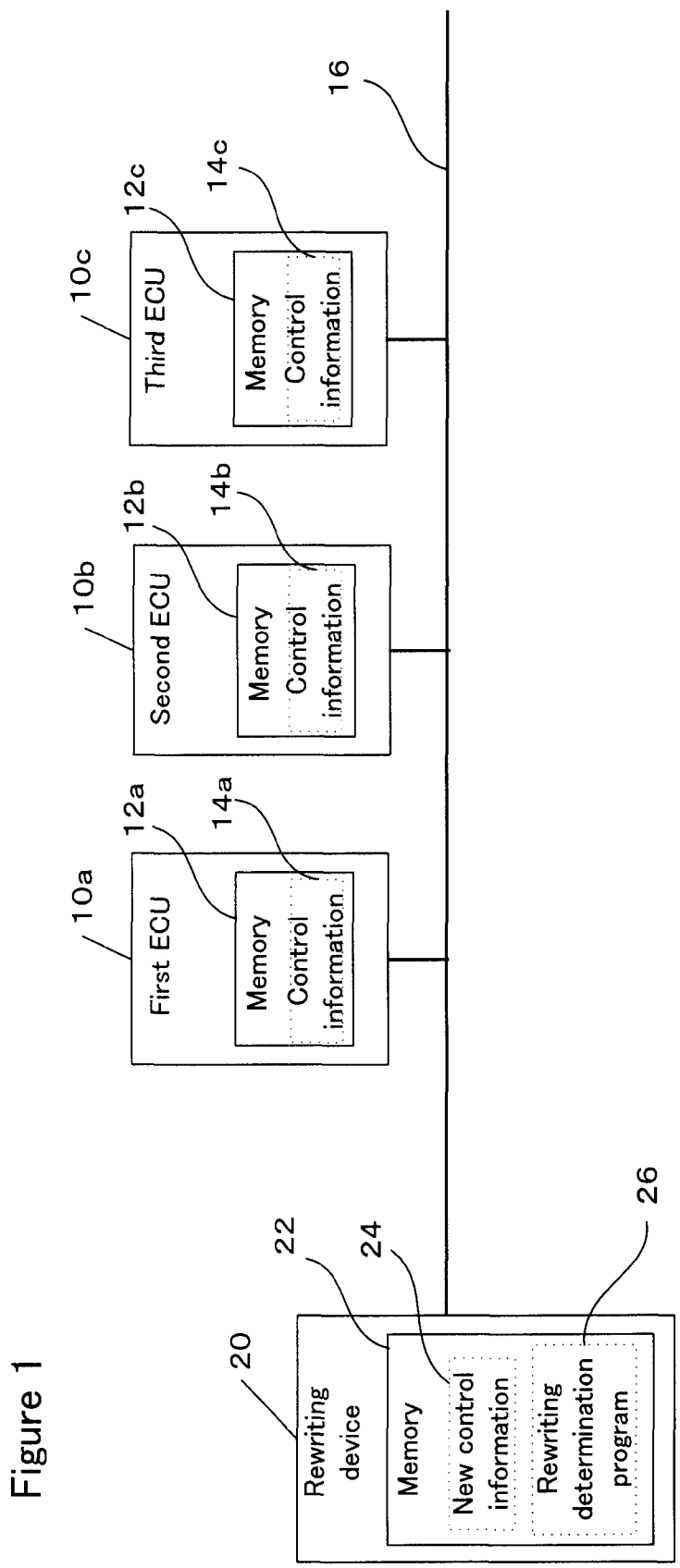
FIG. 1 shows an overall structure of a rewriting system of a vehicle in accordance with one embodiment of the present invention.

Preferred embodiments of the present invention will be described referring to the attached drawings. FIG. 1 shows an overall structure of a rewriting system comprising a plurality of control units mounted on a vehicle in accordance with one embodiment of the present invention.

The plurality of electronic control units (ECUs, referred to as control units hereinafter) are represented by 10a-10c in the figure, which are called a first control unit 10a, a second control unit 10b and a third control unit 10c. The first through third control units 10a-10c may be a control unit for controlling an engine, a control unit for controlling a transmission, and a control unit for controlling a battery. Of course, the control units are not limited to these types. Various types of the control units such as a control unit for controlling an air bag and a control unit for controlling doors and lamps may be included.

Each of the first through third control units 10a-10c is a computer having a central processing unit (CPU) and a memory. The first through third control units 10a-10c have volatile RAMs (not shown in the figure) that are used as temporal storage areas for calculations by the CPUs, and non-volatile memories 12a-12c, such as an EEPROM and a flash memory, that keep the stored contents even if electric power is not supplied.

The non-volatile memories 12a-12c of the first through third control units 10a-10c store one or more programs executed by the CPUs and related data (for example, maps and tables). Various controls such as an engine control, transmission control and battery control are implemented by executing the programs by the CPUs. In the following discussion, software including computer programs and data stored in each non-volatile memory as described above is collectively referred to as "control information". In an example of the figure, the control information 14a-14c is stored in each of the non-volatile memories 12a-12c of the first through third control units 10a-10c, respectively.

In this embodiment, an in-vehicle network (in-vehicle LAN) is formed using a bus network topology. The first through third control units 10a-10c are connected to a bus 16. The first through third control units 10a-10c can communicate with each other according to a predetermined communication protocol such as a CAN protocol. In the example of the figure, the number of the control units is three, which is only one example. Any number of control units can be connected to the bus 16.

An external rewriting device 20 is a device for rewriting (updating) the control information stored in the non-volatile memory of each control unit with new control information 24. The rewriting device 20 is a computer having a CPU and a memory, and is configured to be connectable to the in-vehicle network. A connector for connecting an external device to the in-vehicle network is provided in the vehicle. By connecting the external rewriting device 20 to the connector, the rewriting device 20 can communicate with the control units on the network with each other. The example of the figure shows a form in which the rewriting device 20 is connected such that the rewriting device 20 can communicate with the first through third control units 10a-10c on the bus 16.

The new control information 24 used for the rewriting is pre-stored in the memory of the rewriting device 20. By operating the rewriting device 20 connected to the in-vehicle network by a user, the new control information 24 stored in the rewriting device 20 is sent to a subject control unit via the network. The control unit that has received the new control information 24 rewrites the control information stored in its non-volatile memory with the received new control information 24.

As to a specific manner for the rewriting, any known method can be used. According to one method, new control information used for the rewriting and a control unit to be rewritten (the first control unit 10a in this example) are designated by operating the rewriting device 20 by a user. In response to this user operation, the rewriting device 20 sends a signal for instructing a transition into a rewriting mode to the first control unit 10a. The first control unit 10a sends an acknowledgement reply to the rewriting device 20 and makes a transition from a normal mode into the rewriting mode.

The rewriting device 20 sends a signal for instructing a start of rewriting together with data indicating a rewriting area (address range) to the first control unit 10a. The first control unit 10a erases the control information 14a stored in the indicated rewriting area of its non-volatile memory 12a (if no information is stored, this erasing operation is not performed). When the erasing is completed, an acknowledgement of the start of rewriting is replied to the rewriting device 20.

The rewriting device 20 sends the new control information 24 on a data block basis. Each data block has a predetermined length. The data blocks are serially sent. The first control unit 10a writes the received data block in the rewriting area. Every writing of one data block is completed, a signal indicating an end of writing is replied to the rewriting device 20. The rewriting device 20 sends a next data block in response to this signal. After all the data blocks are sent, the rewriting device 20 sends a signal for instructing a transition into the normal mode if the signal indicating the end of writing of the last data block is received from the first control unit 10a. The first control unit 10a sends an acknowledgement reply to the rewriting device 20 and makes a transition from the rewriting mode into the normal mode. Thus, the control information 14a is rewritten with the new control information 24.

Such a rewriting process is performed for each of the control units in turn. By operating the rewriting device 20 by a user, each of the control units to be rewritten can be designated in turn to perform the rewriting on each of the control units. In this embodiment, the rewriting for the control unit 10b is performed after the rewriting for the first control unit 10a is performed. The rewriting for the third control unit 10c is performed after the rewriting for the second control unit 10b is performed. The sequence of the control units to be rewritten may be arbitrarily determined. The rewriting may be started from any control unit.

A program 26 (referred to as a rewriting determination program, hereinafter) for determining a rewriting (updating) state of each control unit is stored in the memory of the rewriting device 20. The rewriting device 20 sends the rewriting determination program 26 to one of the plurality of control units to be rewritten. A control unit to which the program is sent can be arbitrarily determined by, for example, operating the rewriting device by a user. In this example, the rewriting determination program 26 is sent to the first control unit 10a. The first control unit 10a stores the received rewriting determination program 26 in a memory (which may be the non-volatile memory) and activates the program at a predetermined timing.

Figure 2:
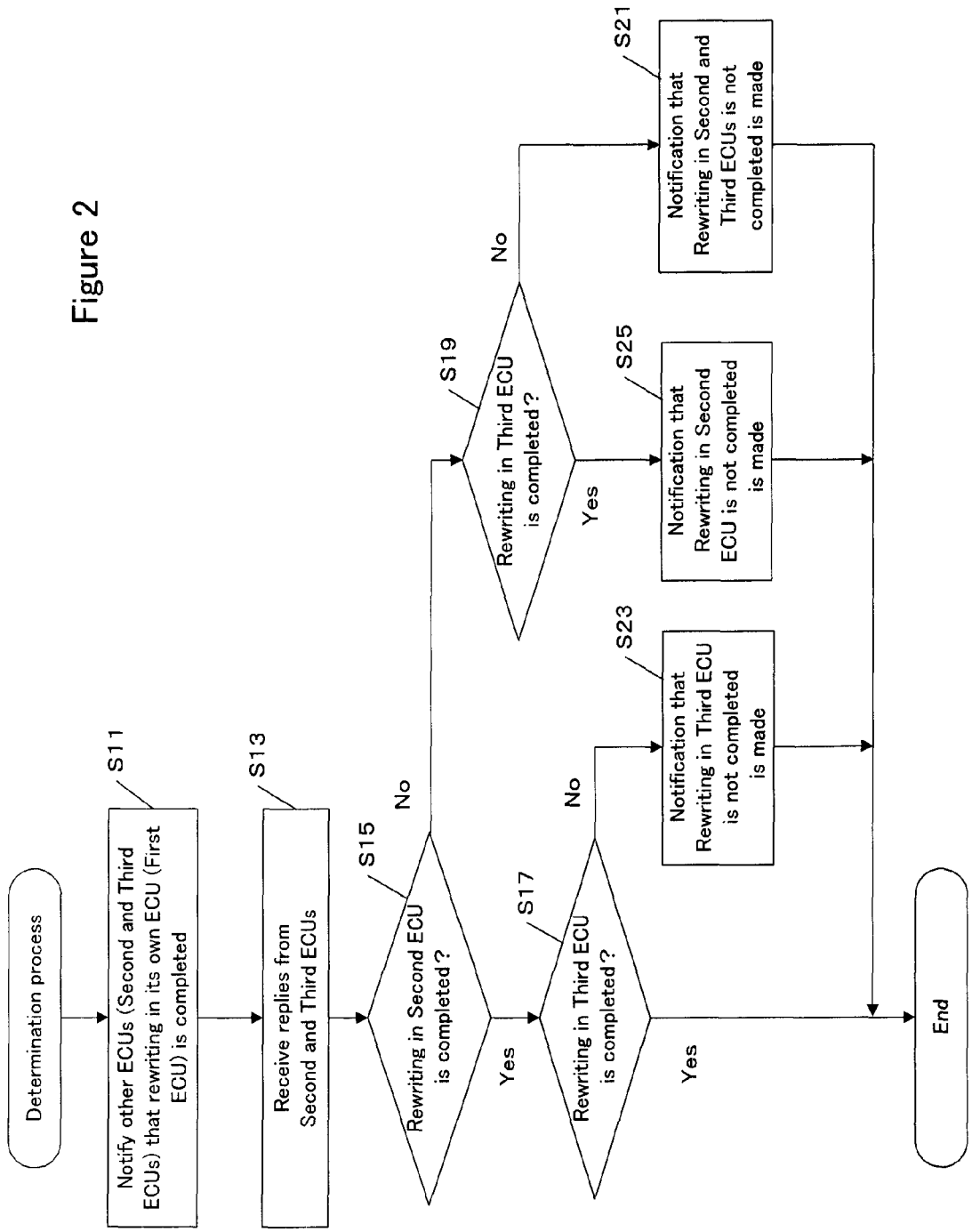
FIG. 2 shows a flowchart of a process for determining whether rewriting in other electronic control units has been completed in accordance with one embodiment of the present invention.

FIG. 2 shows a flowchart of a process implemented by the rewriting determination program 26 in a case where the number of the control units to be rewritten is three (the first through the third control units 10a-10c) as shown in FIG. 1. In this embodiment, this process is activated by the first control unit 10a in response to a completion of the rewriting of the control information 14a with the new control information 24 in the first control unit 10a. Thereafter, this process is performed at predetermined time intervals.

In step S11, the fact that rewriting the old control information 14a with the new control information 24 is completed in the first control unit (ECU) 10a that has received the rewriting determination program 26 is notified to the other second and third control units 10b and 10c by sending a first rewriting completion signal. In response to receiving the first rewriting completion signal, the second and third control units 10b and 10c reply second and third rewriting state signals to the first control unit 10a. Here, the second rewriting state signal is a signal indicating whether rewriting the old control information 14b with the new control information 24 is completed in the second control unit 10b. The third rewriting state signal is a signal indicating whether rewriting the old control information 14c with the new control information 24 is completed in the third control unit 10c. In each control unit, a program for replying a response when the first rewriting completion signal is received is pre-stored. The second and third rewriting state signals can be replied by executing these programs.

In step S13, the first control unit 10a receives the replies, that is, the second and third rewriting state signals, from the second and third control units 10b and 10c.

In step S15, it is determined, by examining the second rewriting state signal, whether the rewriting is completed in the second control unit 10b. In steps S17 and S19, it is determined, by examining the third rewriting state signal, whether the rewriting is completed in the third control unit 10c.

If the determination results in both steps S15 and S19 are No, it indicates that the rewriting is not completed in the second or third control unit 10b or 10c. Therefore, a notification indicating that the rewriting in the second and third control units 10b and 10c is not completed is made in step S21.

If the determination of step S15 is Yes and the determination of step S17 is No, it indicates that the rewriting in the second control unit 10b is completed while the rewriting in the third control unit 10c is not completed. Therefore, a notification that the rewriting in the third control unit 10c is not completed is made in step S23.

If the determination of step S15 is No and the determination of step S19 is Yes, it indicates that the rewriting in the third control unit 10c is completed while the rewriting in the second control unit 10b is not completed. Therefore, a notification that the rewriting in the second control unit 10b is not completed is made in step S25.

If the determination of step S15 is Yes and the determination of step S17 is Yes, it indicates that the rewriting in both the second and third control units 10b and 10c is completed. Therefore, the process exits.

Although described later, the first control unit 10a cancels all the notifications in response to receiving a predetermined clear command (signal for requesting for clearing) from a diagnosis apparatus after it is determined that the rewriting in the second and third control units 10b and 10c is completed. The repetition of the determination process in FIG. 2 is stopped with this cancel of the notifications.

The "notification" is made so as to notify a user of one or more control units in which the rewriting is not completed, as described above. Here, one embodiment of the notification form will be described. In this embodiment, a code for identifying an abnormality (for example, a diagnosis code such as SAE code) and a warning lamp are utilized, which are conventionally used for a diagnosis of the control unit. The identification code is assigned to each control unit such that a control unit where an abnormality has occurred can be identified. When the rewriting in the second control unit 10b is not completed, the identification code indicating an abnormality of the second control unit 10b is used. When the rewriting in the third control unit 10c is not completed, the identification code indicating an abnormality of the third control unit 10c is used. For example, when the second control unit 10b is a control unit for a CVT (continuously variable transmission), the identification code assigned to an abnormality of the control unit for a CVT is used. When the third control unit 10c is a control unit for a battery, the identification code assigned to an abnormality of the control unit for a battery is used. In steps S21 through S25, the notification is made by outputting (generating) the identification code of a control unit in which the rewriting is determined as incomplete. The outputted identification code is recorded and kept in a predetermined storage area (for example, a RAM for backup (SRAM) that is always provided with electric power) of the first control unit 10a such that the diagnosis apparatus can read it.

Figure 3:
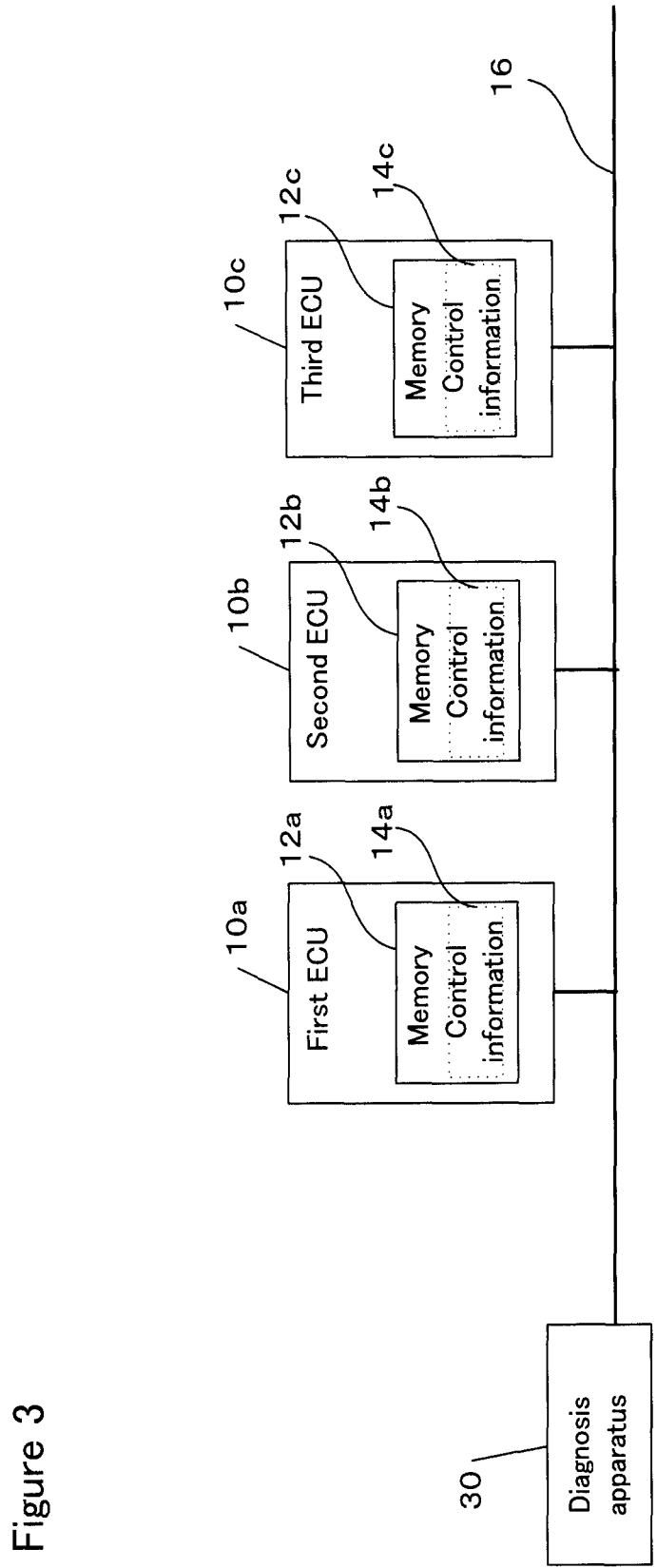
FIG. 3 shows an overall structure of a rewriting system to which a diagnosis apparatus is connected in accordance with one embodiment of the present invention.

Referring to FIG. 3, a similar diagram to FIG. 1 is shown. Instead of the rewriting device 20, a diagnosis apparatus 30 is connected to the in-vehicle network. The diagnosis apparatus 30 is configured such that it is connected to the in-vehicle network by connecting the diagnosis apparatus 30 to a connector, in a similar way to the rewriting device 20. This connection enables the diagnosis apparatus 30 to communicate with control units on the network with each other. The connector used for the diagnosis apparatus may be the same as that of the rewriting device 20, or may be different from that of the rewriting device 20. In the former case where the same connector is used, the diagnosis apparatus 30 is connected after the rewriting device 20 is disconnected.

As the diagnosis apparatus 30, an existing diagnosis apparatus may be used. Such a diagnosis apparatus 30 is configured to send to each control unit a signal for requesting the outputted identification code(s) when the diagnosis apparatus 30 is connected to the in-vehicle network. In response to this signal, each control unit reads the identification code(s) recorded in a predetermined storage area of the control unit and sends the identification code(s) to the diagnosis apparatus 30. The diagnosis apparatus 30 receives the identification code(s) and displays them on a display panel of the diagnosis apparatus 30. Therefore, the identification code(s) outputted in steps S21 through S25 can be displayed on a display panel of the diagnosis apparatus 30 by connecting the diagnosis apparatus 30 to the in-vehicle network. A user can view this display and identify one or more control units in which the rewriting is not completed.

Conventionally, one or more predetermined warning lamps are provided in the vehicle. When an identification code indicating an abnormality is outputted, a warning lamp corresponding to the identification code is turned on or blinked, thereby notifying a driver of the abnormality. For example, if an identification code indicating an abnormality of a control unit for the engine control is outputted, a warning lamp indicating the abnormality of the engine is turned on or blinked concurrently with this output of the identification code. In this embodiment, this technique is utilized. That is, a warning lamp is turned on (hereinafter, including "blinked") concurrently with the output of the identification code in steps S21 through S25.

Thus, a user can recognize whether there is a control unit in which the rewriting is not completed by viewing whether the warning lamp is turned on or not while identifying the control unit in which the rewriting is not completed via the diagnosis apparatus 30. For example, even if an operator is changed during the rewriting work, the new operator can immediately confirm a control unit in which the rewriting is not completed by connecting the diagnosis apparatus 30. Therefore, the new operator can start the rewriting process of the control unit and complete the rewriting work. It can be prevented that an unrewritten portion or duplicately rewritten portion occurs. Because an existing identification code and an existing diagnosis apparatus can be utilized, high costs can be avoided. Furthermore, because a diagnosis apparatus to which a user (especially, maintenance staff) is accustomed can be utilized, it can be avoided that inconvenience is given to a user when conducting the rewriting work.

Although there are advantages as described above, in an alternative embodiment, a code scheme different from the existing identification code may be used. Furthermore, the identification code may be displayed on a predetermined display apparatus in the vehicle or on a display panel of the rewriting device 20. Instead of the warning lamp, a predetermined sound or voice may be used for the notification.

Conventionally, erasing the identification code recorded by a control unit and turning off the warning lamp are performed by sending a predetermined clear command from the diagnosis apparatus 30 to the control unit. That is, in general, after the diagnosis apparatus 30 reads the identification code from each control unit, the apparatus 30 sends the clear command to each control unit. Sending of the clear command can be performed by operating the diagnosis apparatus 30 by a user. The control unit that has received the clear command erases the identification code recorded in the predetermined storage area of the control unit while turning the warning lamp off.

However, as shown in FIG. 2, if the notification is cancelled by erasing the identification code(s) and turning the warning lam off until the rewriting for all the control units is completed (that is, when there is a control unit in which the rewriting is not completed), a user cannot identify a control unit in which the rewriting is not completed. Especially, if such a cancel is performed when an operator for the rewriting work is changed, the new operator who takes over the rewriting work cannot grasp the progress of the rewriting work. This may cause an unrewritten portion or duplicately rewritten portion. Therefore, in one embodiment of the invention, even if the clear command is received from the diagnosis apparatus 30, a control unit that has outputted the identification code(s) and turned on the warning lamp continues keeping the output of the identification code(s) and the on-state of the warning lamp until the rewriting is completed for all the control units.

After the rewriting for all the control units is completed, the above notification is cancelled in response to a receipt of the clear command sent from the diagnosis apparatus 30. That is, if the clear command is received from the diagnosis apparatus 30 after the determination of step S17 of FIG. 2 is Yes, the first control unit 10a cancels the notification. Thus, the first control unit 10a erases the identification code(s) recorded in the predetermined storage area while turning the warning lamp off.

Thus, if there is a control unit in which the rewriting is not completed, the identification code is kept in the storage area and the warning lamp remains on for the control unit even if the clear command is issued. Therefore, a user can intentionally issue the clear command by operating the diagnosis apparatus 30. If the warning lamp remains on as a result of the issuance of the clear command, the user can determine that there is a control unit in which the rewriting is not completed. In this case, by reading an identification code by operating the diagnosis apparatus again, the user can cause the identification code to be displayed on the display panel of the diagnosis apparatus 30.

On the other hand, if there is no control unit in which the rewriting is not completed, the identification code(s) is erased from the storage area, and the warning lamp is turned off. Therefore, a user can intentionally issue the clear command by operating the diagnosis apparatus 30. If the warning lamp is turned off as a result of the issuance of the clear command, the user can determine that there is no control unit in which the rewriting is not completed. In this case, if the user tries to read an identification code again by operating the diagnosis apparatus, no identification code is displayed on the display panel of the diagnosis apparatus 30. By confirming that no identification code is displayed, the user can also determine that there is no control unit in which the rewriting is not completed.

As to the timing at which the rewriting determination program 26 for executing the determination process as shown in FIG. 2 is sent (loaded) to a control unit, such loading may be performed before or after the rewriting in this control unit is performed. Activation of the rewriting determination program 26 may be implemented by sending a predetermined activation signal to this control unit by operating the rewriting device 20 by a user. Alternatively, the rewriting determination program 26 may be created such that it is activated in response to the completion of the rewriting in this control unit.

Control units to which the rewiring determination program 26 sends the first rewriting completion signal may be previously described in the rewriting determination program 26, or may be designated through a user operation on the rewriting device 20. In the latter case, the designated control units can be passed to the rewriting determination program 26 as parameters.

Figure 4:
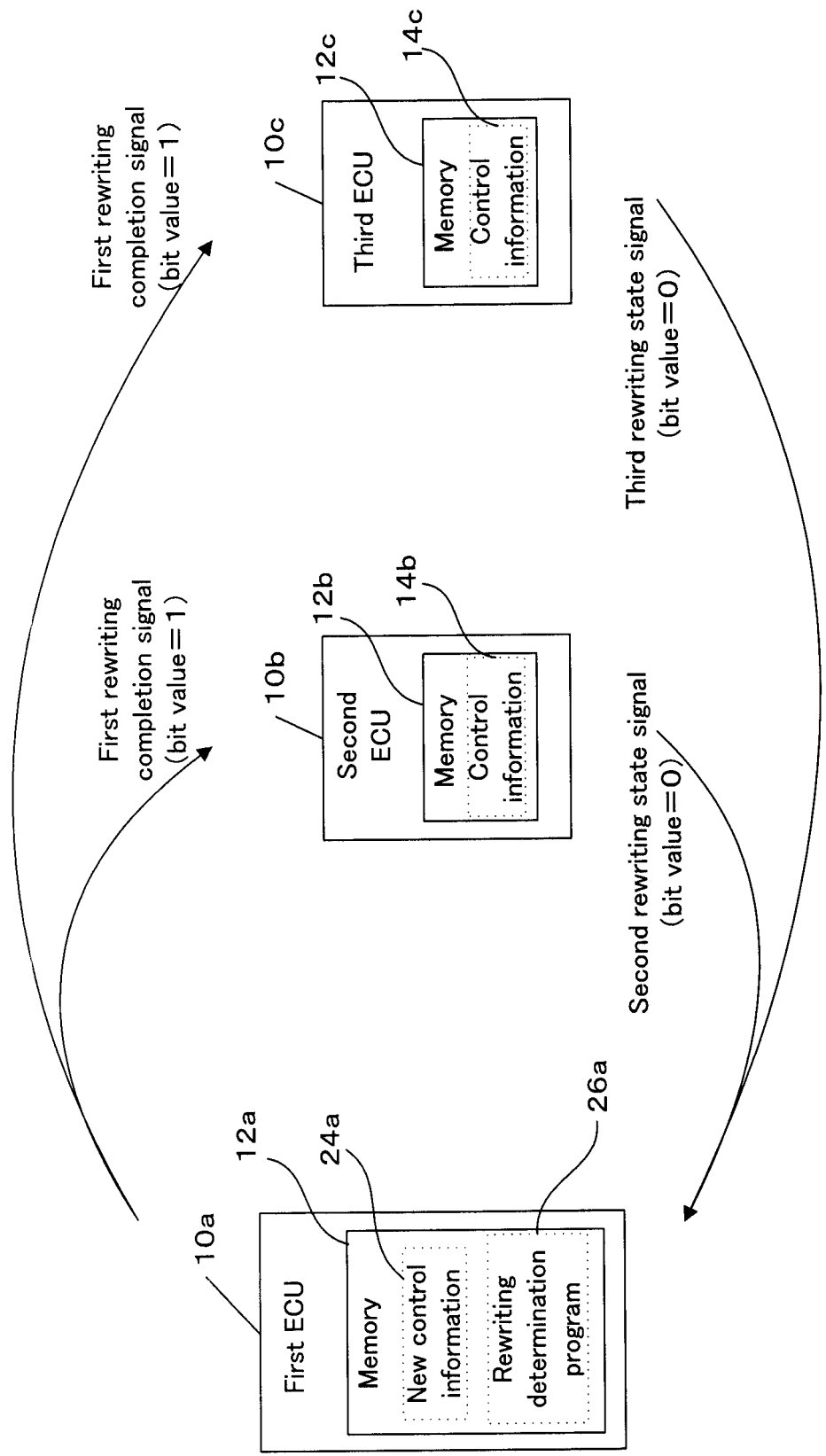
FIG. 4 schematically shows a transition of a process for determining whether rewriting in other electronic control units has been completed in accordance with one embodiment of the present invention.
Figure 5:
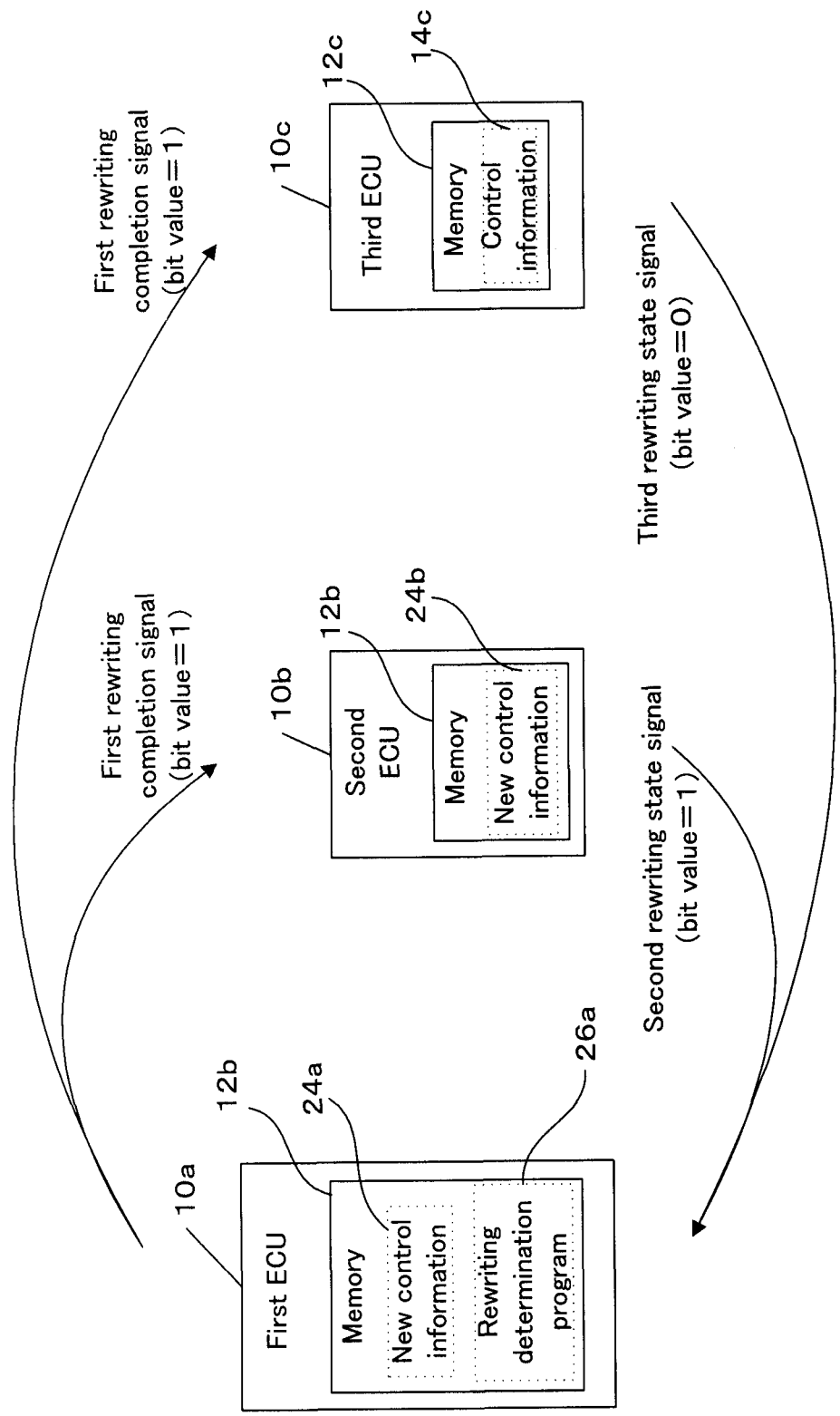
FIG. 5 schematically shows a transition of a process for determining whether rewriting in other electronic control units has been completed in accordance with one embodiment of the present invention.
Figure 6:
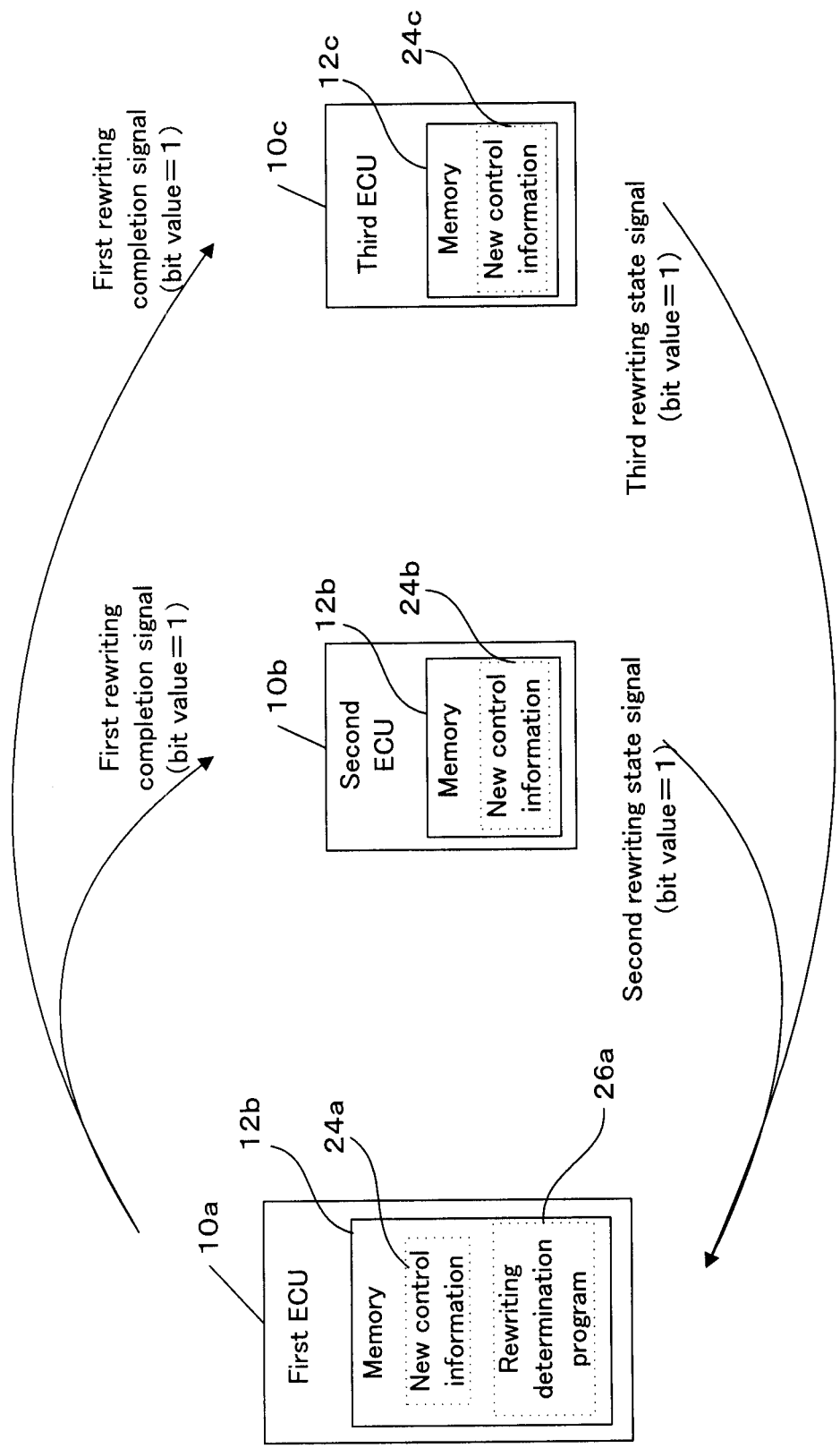
FIG. 6 schematically shows a transition of a process for determining whether rewriting in other electronic control units has been completed in accordance with one embodiment of the present invention.

Referring to FIGS. 4 through 6, a specific embodiment of a process by the rewriting determination program 26 as described referring to FIG. 2 will be described.

FIG. 4 shows a state in which rewriting the old control information 14a with the new control information 24 has been completed in the first control unit (ECU) 10a, and the rewriting determination program 26 has been sent (loaded) to the first control unit 10a. Therefore, it is shown that the new control information and the rewriting determination program have been stored as indicated by reference numerals 24a and 26a, respectively, in the memory 12a of the first control unit 10a.

Because the rewriting has been completed in the first control unit 10a, the first control unit 10a sends a first rewriting completion signal to the second and third control units 10b and 10c. In this example, the rewriting completion signal is a signal for notifying a completion of the rewriting by a single bit having a value of one (1).

In response to receiving the first rewriting completion signal, the second and third control units 10b and 10c send a second rewriting state signal and a third rewriting state signal to the first control unit 10a, respectively. Here, the rewriting state signal is a signal for notifying a rewriting state by a single bit. If the rewriting is completed, one (1) is set in the single bit. If the rewriting is not completed, zero is set in the single bit. At a time shown in FIG. 4, because the rewriting in the second and third control units has not been completed, zero is set in the single bit of the second and third rewriting state signals.

The first control unit 10a receives the second and third rewriting state signals, and determines that the value of the single bit of each of the received signals is zero. Therefore, the first control unit 10a determines that the rewriting in the second and third control units 10b and 10c has not been completed. In response to this determination, as described above, the first control unit 10a outputs an identification code of the second control unit 10b and an identification code of the third control unit 10c, and records them in a predetermined storage area. By connecting the diagnosis apparatus 30 to the in-vehicle network, the recorded identification codes are read and displayed on the diagnosis apparatus 30. Thus, a user is notified that the rewriting in the second and third control units 10b and 10c has not been completed. The first control unit 10a turns a predetermined warning lamp on to notify the user of a presence of a control unit in which the rewriting has not been completed.

As described above, even if the clear command is issued through the diagnosis apparatus 30, the first control unit 10a keeps the recorded identification codes of the second and third control units 10b and 10c while keeping the warning lamp on. The user can recognize that there is a control unit in which the rewriting has not been completed by viewing that the warning lamp is not turned off in response to the issuance of the clear command. The user can operate the diagnosis apparatus 30 again to read the kept identification codes and display them on the display panel of the diagnosis apparatus 30.

Next, FIG. 5 shows a state after a certain time has passed from the state of FIG. 4. This state indicates that the rewriting of the old control information 14b with the new control information 24 has been completed in the second control unit 10b. It is shown that the new control information has been stored in the memory 12b of the second control unit 10b by reference numeral 24b.

In such a state, when the first control unit 10a sends the first rewriting completion signal (the signal bit has 1) to the second and third control units 10b and 10c in a similar way to FIG. 4, the second control unit 10b sets one (1) in the single bit of the second rewriting state signal and replies the signal to the first control unit 10a. The third control unit 10c sets zero in the single bit of the third rewriting state signal and replies the signal to the first control unit 10a because the rewriting has not been completed.

The first control unit 10a receives the second and third rewriting state signals, and determines that the value of the signal bit of the second rewriting state signal is one while the value of the signal bit of the third rewriting state signal is zero. Therefore, the first control unit 10a determines that the rewriting in the third control unit 10c has not been completed. In response to this determination, the first control unit 10a outputs the identification code of the third control unit 10c and records it in the predetermined storage area. This recording is performed by overwriting. Therefore, among the identification codes recorded in FIG. 4, the identification code of the second control unit 10b is erased. By connecting the diagnosis apparatus 30 to the in-vehicle network, the recorded identification code can be read and displayed on the diagnosis apparatus 30. Thus, a user can be notified that the rewriting in the third control unit 10c has not been completed. Furthermore, because the warning lamp is on at the time of FIG. 4, the first control unit 10a keeps the on-state of the warning lamp, thereby notifying the user of a presence of a control unit in which the rewriting has not been completed.

As described above, even if the clear command is issued through the diagnosis apparatus 30, the first control unit 10a keeps the recorded identification code of the third control unit 10c while keeping the warning lamp on. The user can recognize that there is a control unit in which the rewriting has not been completed by viewing that the warning lamp is not turned off in response to the issuance of the clear command. The user can operate the diagnosis apparatus 30 again to read and display the kept identification code on the display panel of the diagnosis apparatus 30.

Next, FIG. 6 shows a state after a certain time has passed from the state of FIG. 5. This state shows that rewriting the old control information 14c with the new control information 24 has been completed in the third control unit 10c. Therefore, it is shown that the new control information has been stored in the memory 12c of the third control unit 10c by reference numeral 24c.

In such a state, the first control unit 10a sends the first rewriting completion signal (the single bit has 1) to the second and third control units 10b and 10c in a similar way to FIGS. 4 and 5. In response to this, the second control units 10b sets one (1) in the single bit of the second rewriting state signal and replies the signal to the first control unit 10a. The third control unit 10c sets one in the single bit of the third rewriting state signal and replies the signal to the first control unit 10a because the rewriting has been completed.

The first control unit 10a receives the second and third rewriting state signals and determines that the value of the single bit of each of the second and third rewriting state signals is one (1). Therefore, the first control unit 10a determines that the rewriting has been completed for all the control units. When the diagnosis apparatus 30 is connected to the in-vehicle network, the identification code presently recorded (that is, a code indicating that the rewriting in the third control unit 10c has not been completed, as shown in FIG. 5) is read. At this time, if the clear command is issued through the diagnosis apparatus 30, the recorded identification code is erased while the warning lamp is turned off. By viewing that the warning lamp is turned off, the user can recognize that the rewriting for all the control units has been completed. Furthermore, even by confirming that no identification code is displayed on the display panel of the diagnosis apparatus 30 as a result of reading operation of the identification code through the diagnosis apparatus 30, the user can recognize that the rewriting for all the control units has been completed.

In the embodiment in FIGS. 4 through 6, the rewriting in the second control unit 10b is completed prior to the completion of the rewriting in the third control unit 10c. However, a similar process is performed even when the rewriting in the third control unit 10c is completed prior to the completion of the rewriting in the second control unit 10b. Furthermore, in this embodiment, the number of control units to be rewritten is three. Of course, a similar process is performed for any number of control units to be rewritten.

The above notification takes a display form that identifies a control unit in which the rewriting is not completed, thereby enabling a user who conducts the rewriting work to grasp how many control units in which the rewriting is not completed there are.

Alternatively, the notification may take a display form that identifies a control unit in which the rewriting is completed. In this case, at the time at which step S11 is performed in FIG. 2, a code (which may be an existing diagnosis code as described above) that identifies the first control unit 10a is outputted. In step S23, a code that identifies the second control unit 10b is outputted. In step S25, a code that identifies the third control unit 10c is outputted. Step S21 is not performed. If the output of the code is performed, this code is kept in the storage area without being erased. Therefore, when the rewriting is completed for all the control units, the codes for all the control units have been recorded. By connecting the diagnosis apparatus to the in-vehicle network, these codes can be displayed. At the time at which the rewriting in the first control unit is completed, the warning lamp is turned on. Thereafter, the warning lamp is kept on until the rewriting is completed for all the control units. Such a notification also enables a user to grasp the progress of the rewriting work. Erasing the codes and turning the warning lamp off can be performed in response to the clear command from the diagnosis apparatus 30 after the rewriting is completed for all the control units.

In the above embodiment, in response to the completion of the rewriting in the first control unit 10a that has received the rewriting determination program 26, the first control unit 10a activates the determination program 26 to send the first rewriting completion signal having a single bit value of one (1) to the other control units 10b and 10c. Alternatively, before the rewiring in the first control unit 10a is completed, the determination program 26 may be activated. In this case, the first rewriting completion signal having a single bit value of zero may be sent to the other control units 10b and 10c until the rewriting is completed for the first control unit 10a. The other control units 10b and 10c may not respond to the first rewriting completion signal having a single bit value of zero.

Preferably, the rewriting determination program 26 is sent (loaded) to a control unit (the first control unit 10a in the above embodiment) for which the rewriting is first performed in the rewriting work. In doing so, from the time at which the rewriting in the control unit is completed, the progress of the rewriting in the other control units can be known. However, the rewriting determination program may be loaded to another control unit (for example, the second control unit 10b) that is different from the control unit for which the rewriting is first performed. In this case, in response to the completion of the rewriting in the second control unit 10b, the rewriting states of the other control units (that is, the first and third control units 10a and 10c) are determined. At this time, because the rewriting in the first control unit 10a has been already completed, the identification code of the first control unit 10a is not outputted. Only the identification code of the third control unit 10c in which the rewriting is not completed is outputted.

Thus, by loading the rewriting determination program 26 to any one of the control units, a control unit in which the rewriting is not completed is automatically determined and notified. Therefore, a user can immediately grasp the progress of the rewriting work. Even if a user who conducts the rewriting work is changed, it is prevented that an unrewritten portion or duplicately rewritten portion occurs because the progress of the rewriting work is confirmed in real time.

In this embodiment, the external rewriting device 20 is used for the rewriting. Alternatively, another device may be used for the rewriting. For example, new control information and the rewriting determination program are recorded in a storage medium such as a CD. A predetermined control unit may read the new control information and the rewriting determination program from the storage medium and load them into its memory. Or, the predetermined control unit may download the new control information and the rewriting determination program into its memory through wireless or wired communication. The predetermined control unit sends the new control information to a plurality of control units to be rewritten while sending the rewriting determination program to any one of the control units. Because the predetermined control unit plays a role similar to the rewriting device 20, connecting the rewriting device 20 to the in-vehicle network is not required.

The present invention should not be limited to the foregoing description of the embodiments and may be taken into practice by adding various modifications to the foregoing embodiments without departing from the gist of the invention.

What is claimed is:

1. A rewriting system, comprising:
a plurality of electronic control units mounted on a vehicle, each of the plurality of electronic control units including a storage device for storing control information; and
a device for sending new control information to rewrite the control information stored in the storage device of each of the plurality of electronic control units with the new control information,
wherein one of the plurality of electronic control units is configured to make a determination whether the rewriting in the other of the plurality of electronic control units has been completed in response to a completion of the rewriting in the one of the plurality of electronic control units, and make a notification of a result of the determination,
wherein the device sends a program for implementing the determination to the one of the plurality of electronic control units, and
wherein the one of the plurality of electronic control units makes the determination by executing the program in response to the completion of the rewriting in the one of the plurality of electronic control units.

2. The rewriting system of claim 1, wherein the one of the plurality of electronic control units makes the notification by outputting an identification code of each of the other electronic control units for which it is determined that the rewriting is not completed such that a diagnosis apparatus can read and display the identification code.

3. The rewriting system of claim 2, wherein even if a request for cancelling the notification is received from the diagnosis apparatus, the one of the plurality of electronic control units continues the notification without cancelling until the rewriting in each of the other electronic control units has been completed.

4. A rewriting method, comprising:

providing a plurality of electronic control units mounted on a vehicle, each of the plurality of electronic control units including a storage device for storing control information;

providing a device for sending new control information to rewrite the control information stored in the storage device of each of the plurality of electronic control units with the new control information;

making a determination by one of the plurality of electronic control units whether the rewriting in the other of the plurality of electronic control units has been completed in response to a completion of the rewriting in the one of the plurality of electronic control units; and making a notification of a result of the determination, the rewriting method further comprising sending a program for implementing the determination from the device to the one of the plurality of electronic control units, wherein the step of making the determination includes executing the program in response to the completion of the rewriting in the one of the plurality of electronic control units.

5. The rewriting method of claim 4, wherein the step of making the notification includes outputting an identification code of each of the other electronic control units for which it is determined that the rewriting is not completed such that a diagnosis apparatus can read and display the identification code.

6. The rewriting method of claim 5, further comprising, even if a request for cancelling the notification is received from the diagnosis apparatus, continuing the notification without cancelling until the rewriting in each of the other electronic control units has been completed.

* * * * *